US012648446B2

(12) United States Patent
Wu et al.

(10) Patent No.: US 12,648,446 B2
(45) Date of Patent: Jun. 2, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Che-Chi Wu, Taichung City (TW); Chien-Tang Li, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 618 days.

(21) Appl. No.: 17/897,673

(22) Filed: Aug. 29, 2022

(65) Prior Publication Data

US 2023/0402398 A1 Dec. 14, 2023

(30) Foreign Application Priority Data

Jun. 14, 2022 (TW) ................................. 111122068

(51) Int. Cl.
| | |
|---|---|
| *H10W 42/20* | (2026.01) |
| *H10W 40/00* | (2026.01) |
| *H10W 40/22* | (2026.01) |
| *H10W 44/20* | (2026.01) |
| *H10W 70/65* | (2026.01) |
| *H10W 70/685* | (2026.01) |
| *H10W 74/15* | (2026.01) |
| *H10W 76/63* | (2026.01) |
| *H10W 76/67* | (2026.01) |
| *H10W 90/00* | (2026.01) |

(52) U.S. Cl.
CPC ......... *H10W 42/20* (2026.01); *H10W 40/037* (2026.01); *H10W 40/22* (2026.01); *H10W 44/20* (2026.01); *H10W 90/00* (2026.01); *H10W 90/401* (2026.01); *H10W 90/701* (2026.01); *H10W 44/209* (2026.01); *H10W 44/248* (2026.01); *H10W 70/65* (2026.01); *H10W 70/685* (2026.01); *H10W 74/15* (2026.01); *H10W 76/63* (2026.01); *H10W 76/67* (2026.01); *H10W 90/724* (2026.01); *H10W 90/734* (2026.01)

(58) Field of Classification Search
CPC ...................................................... H01L 23/552
See application file for complete search history.

(56) References Cited

U.S. PATENT DOCUMENTS

| | | | | |
|---|---|---|---|---|
| 8,890,628 | B2 * | 11/2014 | Nair | H10W 90/00 |
| | | | | 257/416 |
| 10,553,515 | B2 * | 2/2020 | Chew | H10W 74/117 |
| 11,195,800 | B2 * | 12/2021 | Jang | H10W 40/22 |
| 11,521,937 | B2 * | 12/2022 | Verhaverbeke | H10W 42/20 |
| 12,137,545 | B2 * | 11/2024 | Yow | H05K 9/0024 |

(Continued)

*Primary Examiner* — Dale E Page
(74) *Attorney, Agent, or Firm* — Studebaker Brackett PLLC

(57) ABSTRACT

An electronic package is provided, in which a package module and a shielding member are disposed on a carrier structure, such that the shielding member covers a top surface and side surfaces of the package module to block the radiation outward from the package module and prevent problem that other electronic components on the carrier structure cannot be transmitted signals normally due to the electromagnetic interference of the package module.

12 Claims, 5 Drawing Sheets

(56)     References Cited

U.S. PATENT DOCUMENTS

| | | | | |
|---|---|---|---|---|
| 2004/0231872 | A1* | 11/2004 | Arnold | H10W 76/12 |
| | | | | 257/E23.128 |
| 2005/0035436 | A1* | 2/2005 | Novak | H10W 42/20 |
| | | | | 257/E23.079 |
| 2006/0255434 | A1* | 11/2006 | Degani | H10W 42/20 |
| | | | | 257/659 |
| 2008/0179718 | A1* | 7/2008 | Wu | H10W 42/20 |
| | | | | 257/659 |
| 2014/0062607 | A1* | 3/2014 | Nair | H10W 90/00 |
| | | | | 361/679.02 |
| 2016/0118337 | A1* | 4/2016 | Yoon | H10W 42/20 |
| | | | | 257/774 |
| 2018/0012881 | A1* | 1/2018 | Scanlan | H10W 90/00 |
| 2021/0366838 | A1* | 11/2021 | Han | H10W 42/20 |
| 2023/0268288 | A1* | 8/2023 | Tong | H10W 42/20 |
| | | | | 257/659 |
| 2023/0402398 | A1* | 12/2023 | Wu | H10W 40/22 |
| 2024/0071946 | A1* | 2/2024 | Atluru | H10W 42/20 |
| 2024/0098952 | A1* | 3/2024 | Yow | H05K 9/0024 |
| 2024/0121884 | A1* | 4/2024 | Xu | H05K 1/0222 |
| 2025/0022809 | A1* | 1/2025 | Tsai | H10W 42/20 |

* cited by examiner

ELECTRONIC PACKAGE AND MANUFACTURING METHOD THEREOF

BACKGROUND

1. Technical Field

The present disclosure relates to a semiconductor device, in particular, to an electronic package with a shield member and manufacturing method thereof.

2. Description of Related Art

With the evolution of semiconductor technology, different types of packaging products have been developed for semiconductor products. In order to improve the electrical quality, many semiconductor products have the function of shielding to prevent the generation of electromagnetic interference (EMI).

As shown in FIG. 1, in a conventional radio-frequency (RF) module 1 for avoiding EMI, a plurality of electronic elements 10 (such as radio-frequency and non-radio-frequency chips) are electrically connected to an upper side of a circuit structure 15 by conductive bumps 11 or wires 12, and a metal frame 14 is disposed on the circuit structure 15 and between the electronic elements 10, and then the electronic elements 10 and the metal frame 14 are cladded with an encapsulation layer 13 such as epoxy resin, and a metal layer 19 contacting the metal frame 14 is formed on the encapsulation layer 13, and then arranged on a package substrate 18 by a plurality of solder bumps 17 on a lower side of the circuit structure 15, so that the metal frame 14 and the metal layer 19 protect the electronic elements 10 from external EMI.

However, in the conventional radio-frequency module 1, the circuit structure 15 will generate outward radiation F due to an antenna layer 150, so that the signals of other antenna components on the package substrate 18 will be affected by the electromagnetic interference of the radio-frequency module 1, and the product cannot operate normally. Therefore, there is a need for a solution that addresses the aforementioned shortcomings in the prior art.

SUMMARY

In view of the aforementioned shortcomings of the prior art, the present disclosure provides an electronic package, which comprises: a carrier structure; a package module disposed on one side of the carrier structure, wherein the package module comprises a circuit structure electrically connected to the carrier structure, at least one electronic element disposed on and electrically connected to the circuit structure, and shielding bodies disposed on the circuit structure and surrounding the electronic element; a shielding member disposed on the carrier structure to cover the package module, wherein the shielding member comprises a metal sheet covering the electronic element and at least one shielding leg for supporting the metal sheet on the carrier structure, such that the shielding leg covers a side surface of the package module; and a heat dissipation member disposed on the carrier structure and connected to the shielding member.

The present disclosure further provides a method for manufacturing an electronic package, the method comprises: providing a package module, wherein the package module comprises a circuit structure and at least one electronic element disposed on and electrically connected to the circuit structure; disposing the package module on one side of a carrier structure, wherein the circuit structure is electrically connected to the carrier structure; and disposing a shielding member on the carrier structure, wherein the shielding member covers the package module, and wherein the shielding element comprises a metal sheet covering the electronic element and at least one shielding leg for supporting the metal sheet on the carrier structure, such that the shielding leg covers a side surface of the package module.

In the aforementioned manufacturing method, the circuit structure is further disposed with shielding bodies thereon. For example, the electronic element is surrounded by the shielding bodies; or a plurality of the electronic elements are disposed on the circuit structure, such that at least one of the shielding bodies is located between two adjacent ones of the electronic elements. Alternatively, the shielding bodies are in contact with the metal sheet.

In the aforementioned electronic package and manufacturing method, the package module is disposed on the carrier structure via a plurality of conductive elements.

In the aforementioned electronic package and manufacturing method, the present disclosure further comprises disposing a plurality of solder balls on the other side of the carrier structure.

In the aforementioned electronic package and manufacturing method, the carrier structure has at least one grounding portion electrically connected to the shielding leg.

In the aforementioned manufacturing method, the present disclosure further comprises disposing a heat dissipation member on the carrier structure, wherein the heat dissipation member is connected to the shielding member. For example, the carrier structure has at least one grounding portion electrically connected to the heat dissipation member.

As can be understood from the above, in the electronic package and manufacturing method thereof according to the present disclosure, the shielding member (or shielding legs) is used to shield the side surfaces of the package module, so as to effectively block the radiation outward from the circuit structure, and prevent the problem that other electronic components on the carrier structure cannot be transmitted signals normally due to the electromagnetic interference of the package module. Therefore, compared with the prior art, the electronic package of the present disclosure can improve the reliability of the product.

DETAILED DESCRIPTION

Figure 1:
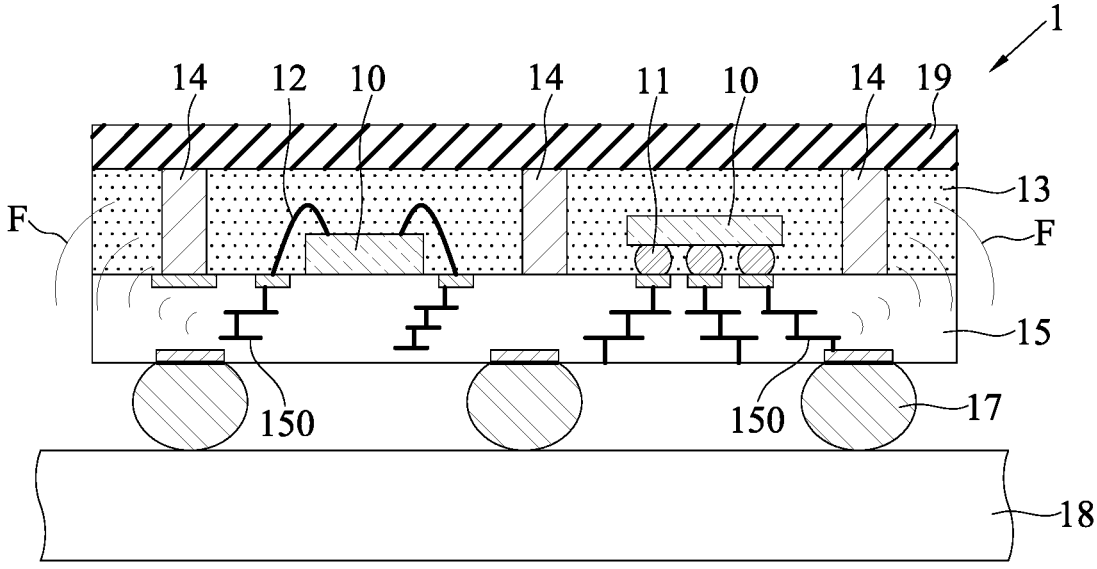
FIG. 1 is a schematic cross-sectional view of a conventional radio-frequency module.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2H are schematic cross-sectional views illustrating a manufacturing method of an electronic package 2 of the present disclosure.

Figure 2A:
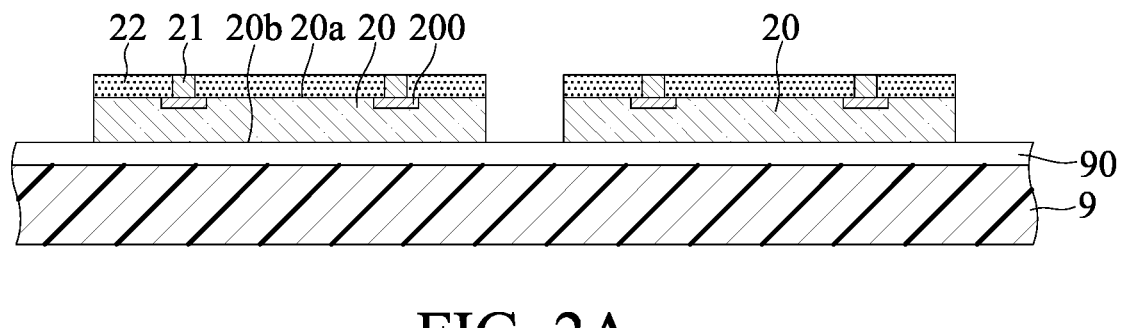
FIG. 2A to FIG. 2H are schematic cross-sectional views illustrating a manufacturing method of an electronic package of the present disclosure.

As shown in FIG. 2A, a plurality of electronic elements 20 spaced apart from each other are disposed on a carrier 9.

The carrier 9 is, for example, a plate body of semiconductor material (such as silicon or glass), formed with a release layer 90 thereon by, for example, coating, so as to bond the plurality of electronic elements 20.

The electronic element 20 is an active element, a passive element, or a combination of the active element and the passive element, where the active element may be a semiconductor chip, and the passive element may be a resistor, a capacitor, or an inductor.

In an embodiment, the electronic element 20 is a semiconductor chip, such as a graphics processing unit (GPU), a high bandwidth memory (HBM), etc. The electronic element 20 has an active surface 20a and an inactive surface 20b opposing the active surface and is disposed on the release layer 90 by a glue material (not shown) with the inactive surface 20b thereof, and the active surface 20a has a plurality of electrode pads 200. Further, conductors 21 such as copper pillars or solder balls can be formed on the electrode pads 200, and a protective layer 22 is formed on the active surface 20a, so that the protective layer 22 covers the electrode pads 200 and the conductors 21, and an end surface of each of the conductors 21 is exposed from the protective layer 22.

In addition, the protective layer 22 is an insulating material such as a nitride (silicon nitride [SiN], etc.), and part of the material of the protective layer 22 and part of the material of the conductors 21 can be removed by a leveling process, such as grinding, such that a top surface of the protective layer 22 is flush with an end surface of each of the conductors 21, so that the end surface of each of the conductors 21 is exposed from the protective layer 22.

Figure 2B:
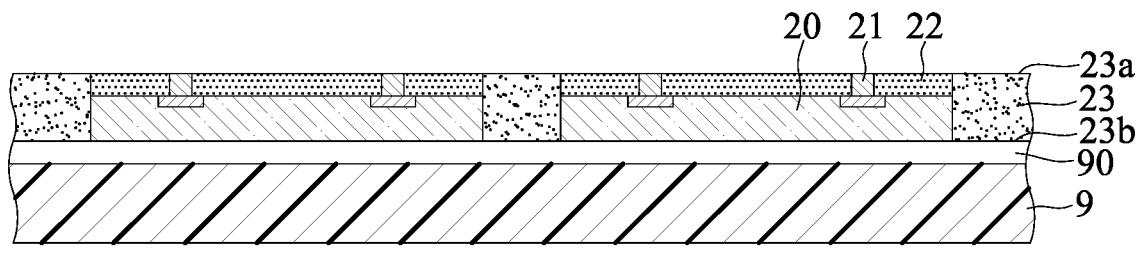

As shown in FIG. 2B, an encapsulation layer 23 is formed on the carrier 9, so that the encapsulation layer 23 clads the electronic elements 20, wherein the encapsulation layer 23 has a first surface 23a and a second surface 23b opposing the first surface 23a, and the protective layer 22 and the end surface of each of the conductors 21 are exposed from the first surface 23a of the encapsulation layer 23, and the encapsulation layer 23 is bonded onto the carrier 9 with the second surface 23b thereof.

In an embodiment, the encapsulation layer 23 is an insulating material, such as polyimide (PI), dry film, an encapsulant such as epoxy resin, or molding compound. For example, the encapsulation layer 23 can be formed on the release layer 90 of the carrier 9 in a manner of liquid compound, injection, lamination, or compression molding.

Further, the first surface 23a of the encapsulation layer 23 can be flushed with the top surface of the protective layer 22 and the end surface of each of the conductors 21 by a leveling process, so that the end surface of each of the conductors 21 is exposed from the first surface 23a of the encapsulation layer 23. For example, the leveling process removes part of the material of the protective layer 22, part of the material of the conductors 21 and part of the material of the encapsulation layer 23 by grinding.

Figure 2C:
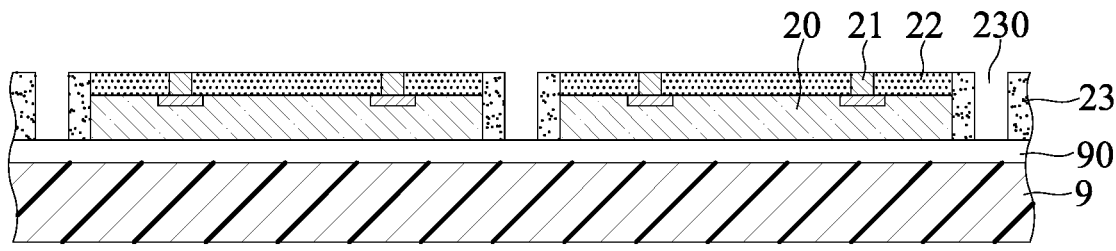

As shown in FIG. 2C, a plurality of through vias 230 are formed on the first surface 23a of the encapsulation layer 23 by a laser method, so that the through vias 230 communicate with the first surface 23a and the second surface 23b of the encapsulation layer 23, and part of a surface of the carrier 9 (or the release layer 90) is exposed from the through vias 230.

In an embodiment, the electronic elements 20 are surrounded by the through vias 230, so that at least one of the through vias 230 is disposed between the electronic elements 20.

Figure 2D:
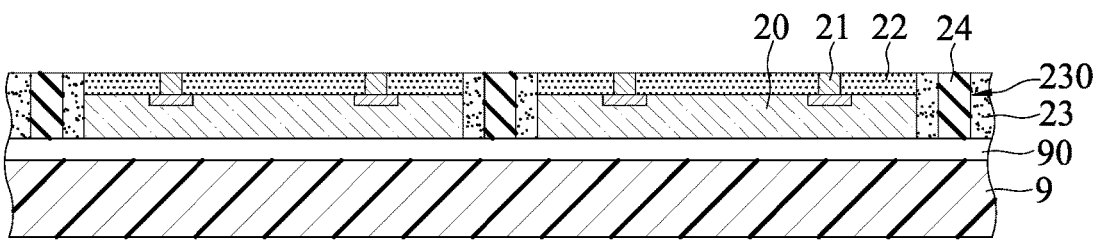

As shown in FIG. 2D, a metal material is formed in the through vias 230, so that the metal material in the through vias 230 is used as shielding bodies 24, and at least one of the shielding bodies 24 is disposed between the electronic elements 20.

In an embodiment, the shielding body 24 is made of electroplating metal, filling material, or conductive glue, and the shielding body 24 is in the shape of a column or a wall.

Figure 2E:
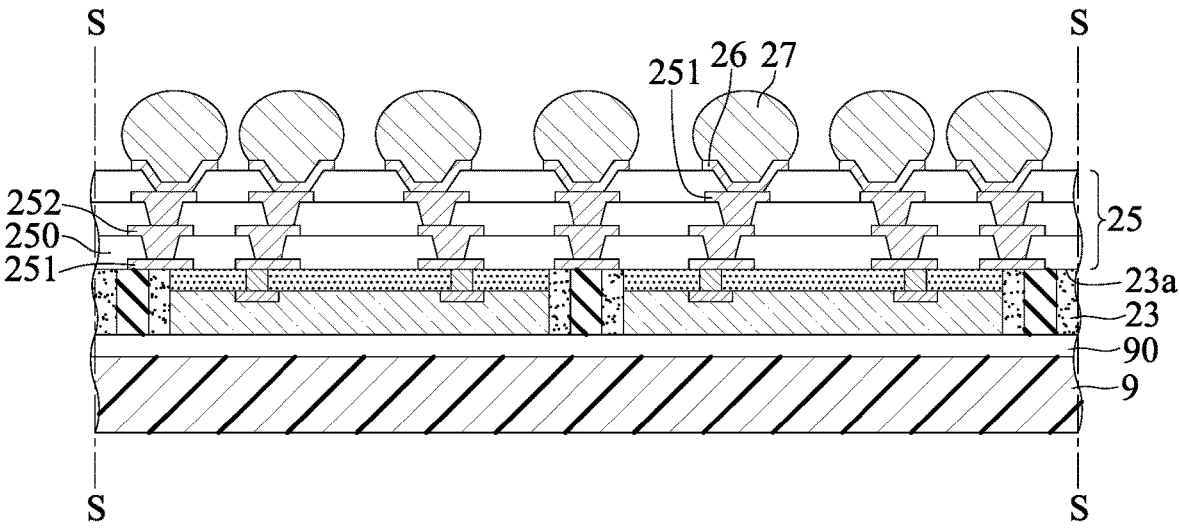

As shown in FIG. 2E, a circuit structure 25 is formed on the first surface 23a of the encapsulation layer 23 and the active surfaces 20a of the plurality of electronic elements 20, and the circuit structure 25 is electrically connected to the plurality of electronic elements 20.

In an embodiment, the circuit structure 25 includes at least one dielectric layer 250 and a circuit layer 251 bonded with the dielectric layer 250, and the circuit layer 251 has an antenna portion 252. For example, the material for forming the dielectric layer 250 is such as polybenzoxazole (PBO), polyimide (PI), prepreg (PP), or other dielectric materials, and the circuit layer 251 and the dielectric layer 250 may be formed by a redistribution layer (RDL) process.

Further, the innermost circuit layer 251 is electrically connected to the electrode pads 200 via the conductors 21, and an under bump metallurgy (UBM) layer 26 is formed on the outermost circuit layer 251 to bond a plurality of conductive elements 27 such as solder balls for connecting other external elements in the subsequent process.

Also, the shielding bodies 24 may be electrically connected to the circuit layer 251 or may be free from being electrically connected to the circuit layer 251.

Figure 2F:
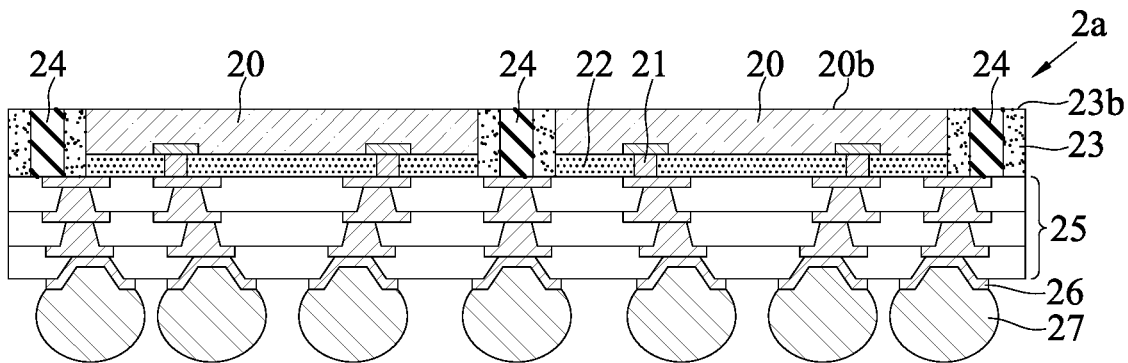

As shown in FIG. 2F, the carrier 9 and the release layer 90 are removed to expose the shielding bodies 24, the second surface 23b of the encapsulation layer 23 and the inactive surfaces 20b of the electronic elements 20, and a singulation process is performed along cutting paths S shown in FIG. 2E to obtain a package module 2a including a plurality of the electronic elements 20.

Figure 2G:
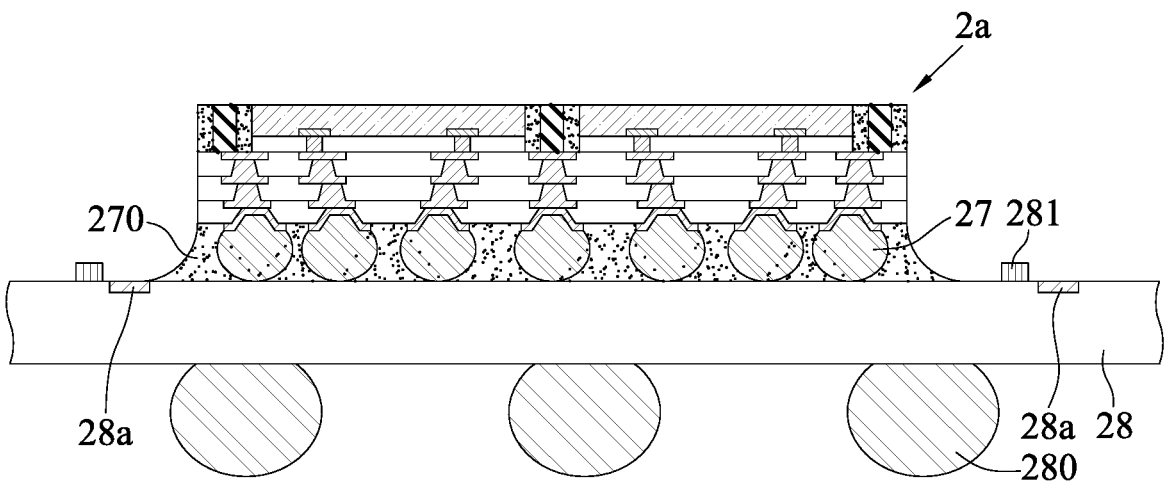

As shown in FIG. 2G, the package module 2a is disposed on a carrier structure 28 by the conductive elements 27.

The carrier structure 28 is in the form of a package carrier, such as a package substrate having a core layer and a circuit structure, a package substrate having a coreless circuit structure, a through-silicon interposer (TSI) with conductive through-silicon vias (TSVs), or other board type. The carrier structure 28 includes at least one routing layer (such as at least one fan out type redistribution layer [RDL]), and has at least one grounding portion 28a. It should be understood that the carrier structure 28 can also be other boards for carrying chips, such as a lead frame, a wafer, or other boards with metal routing, etc., and the present disclosure is not limited to as such.

In an embodiment, the carrier structure 28 can be fabricated in various ways. For example, the circuit layer may be formed by a wafer process, and a silicon nitride or silicon oxide may be formed as an insulating layer by chemical vapor deposition (CVD). Alternatively, the circuit layer can be formed by a general non-wafer process method, that is, a low-cost polymer dielectric material, such as polyimide (PI), polybenzoxazole (PBO), prepreg (PP), molding compound, photosensitive dielectric layer, or other materials, is formed as the insulating layer in a manner of coating.

Further, a plurality of solder balls 280 can be formed on a lower side of the carrier structure 28 to connect to an electronic device such as a circuit board (not shown).

In addition, the conductive elements 27 may be covered by an underfill 270. Further, at least one stopper 281 can be disposed on the carrier structure 28 according to requirements to limit the flow area of the underfill 270.

Figure 2H:
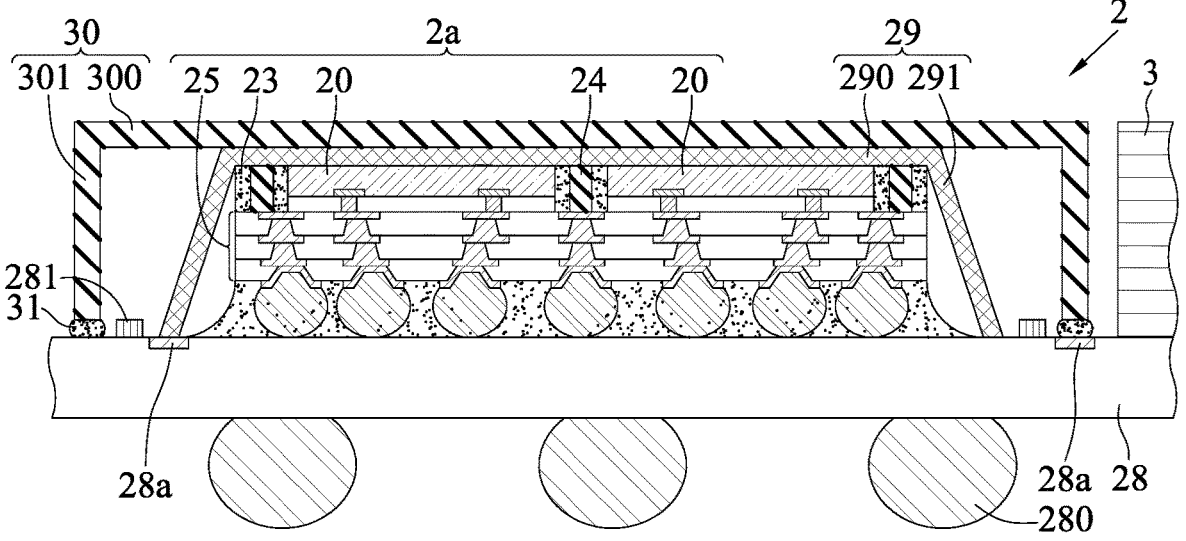

As shown in FIG. 2H, a shielding member 29 is disposed on the carrier structure 28 to cover a top surface and side surfaces of the package module 2a, and the shielding member 29 is in contact with the shielding bodies 24 to cover the electronic elements 20 and side surfaces of the circuit structure 25.

In an embodiment, the shielding member 29 is a frame body, which includes a metal sheet 290 and at least one shielding leg 291 for supporting the metal sheet 290 on the carrier structure 28, and the material of the shielding legs 291 is a conductive material of metal or non-metal (such as graphite). For example, the shielding legs 291 are free from being in contact with the side surfaces of the package module 2a, so that a space is kept between the shielding leg 291 and the package module 2a, such as an open space is provided between the shielding leg 291 and the package module 2a to place other functional elements, such as passive elements, to improve the flexibility of routing design on the carrier structure 28.

In addition, the metal sheet 290 is in contact with the shielding bodies 24 and the inactive surfaces 20b of the electronic elements 20, and at least one of the shielding legs 291 can be electrically connected to the grounding portion 28a. Preferably, the metal sheet 290 covers the entire top of the package module 2a so as to cover the entire inactive surfaces 20b of the electronic elements 20.

Also, a heat dissipation member 30 may be disposed on the carrier structure 28 and is connected to the shielding member 29 to dissipate heat from the electronic elements 20. For example, the structure of the heat dissipation member 30 corresponds to the structure of the shielding member 29.

The heat dissipation member 30 has a heat dissipation body 300 and a plurality of supporting legs 301 disposed on a lower side of the heat dissipation body 300. The heat dissipation body 300 is in the form of a heat sink fin, and the lower side of the heat dissipation body 300 is bonded to the metal sheet 290 of the shielding member 29, and the supporting legs 301 are bonded onto the carrier structure 28 by an adhesive layer 31 such as insulating glue or conductive paste.

In addition, at least one of the supporting legs 301 can also be electrically connected to the grounding portion 28a, and the stoppers 281 are located between the supporting leg 301 and the shielding leg 291.

Therefore, in the manufacturing method of the present disclosure, the shielding member 29 (or the shielding legs 291) shields the side surfaces of the package module 2a (or the circuit structure 25), so as to effectively block the radiation outward from the antenna portion 252 of the circuit structure 25, which prevents other antenna components 3 on the carrier structure 28 from being affected by the electromagnetic interference of the package module 2a. Therefore, compared with the prior art, the electronic package 2 of the present disclosure can maintain the normal operation of the product and improve the reliability of the product.

Further, the electronic package 2 of the present disclosure is configured with multiple sets of shielding mechanisms (the shielding member 29 and the shielding bodies 24) to more effectively protect the electronic elements 20 from being affected by electromagnetic interference, so that the reliability of the product becomes better.

The present disclosure also provides an electronic package 2, which comprises: a carrier structure 28, a package module 2a, and a shielding member 29.

The package module 2a is disposed on one side of the carrier structure 28, wherein the package module 2a comprises a circuit structure 25 electrically connected to the carrier structure 28, and at least one electronic element 20 disposed on and electrically connected to the circuit structure 25.

The shielding member 29 is disposed on the carrier structure 28 to cover the package module 2a, wherein the shielding member 29 comprises a metal sheet 290 for covering the electronic element 20 and at least one shielding leg 291 for supporting the metal sheet 290 on the carrier structure 28, so that the shielding legs 291 cover side surfaces of the package module 2a.

In one embodiment, at least one shielding body 24 is further disposed on the circuit structure 25. For example, the electronic element 20 is surrounded by the shielding bodies 24. Alternatively, a plurality of the electronic elements 20 are disposed on the circuit structure 25, so that at least one of the shielding bodies 24 is located between two adjacent ones of the electronic elements 20. Alternatively, the shielding bodies 24 are in contact with the metal sheet 290.

In one embodiment, the package module 2a is disposed on the carrier structure 28 via a plurality of conductive elements 27.

In one embodiment, a plurality of solder balls 280 are disposed on the other side of the carrier structure 28.

In one embodiment, the carrier structure 28 has at least one grounding portion 28a electrically connected to at least one of the shielding legs 291.

In one embodiment, the electronic package 2 further comprises a heat dissipation member 30 disposed on the carrier structure 28 and connected to the shielding member 29. For example, the carrier structure 28 has at least one grounding portion 28a electrically connected to the heat dissipation member 30.

In view of the above, in the electronic package and manufacturing method thereof according to the present disclosure, the shielding member (or shielding legs) is used to cover the side surfaces of the package module, so as to effectively block the radiation outward from the circuit structure, and prevent the problem that other electronic components on the carrier structure cannot be transmitted signals normally due to the electromagnetic interference of the package module. Therefore, compared with the prior art, the electronic package of the present disclosure can improve the reliability of the product.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
a carrier structure;
a package module disposed on one side of the carrier structure, wherein the package module comprises a circuit structure electrically connected to the carrier structure, at least one electronic element disposed on and electrically connected to the circuit structure, an encapsulation layer disposed on the circuit structure and covering the electronic element, and shielding bodies embedded within the encapsulation layer and surrounding the electronic element, wherein end surfaces of the shielding bodies are flush with an inactive surface of the electronic element and a surface of the encapsulation layer;
a shielding member disposed on the carrier structure to cover the package module, wherein the shielding member comprises a metal sheet covering the electronic element and at least one shielding leg for supporting the metal sheet on the carrier structure, such that the shielding leg covers a side surface of the package module, and wherein the shielding bodies are in contact with the metal sheet; and
a heat dissipation member disposed on the carrier structure and connected to the shielding member,
wherein the shielding member is between the at least one electronic element and the heat dissipation member.

2. The electronic package of claim 1, wherein a plurality of the electronic elements are disposed on the circuit structure, such that at least one of the shielding bodies is located between two adjacent ones of the electronic elements.

3. The electronic package of claim 1, wherein the package module is disposed on the carrier structure via a plurality of conductive elements.

4. The electronic package of claim 1, further comprising a plurality of solder balls disposed on the other side of the carrier structure.

5. The electronic package of claim 1, wherein the carrier structure has at least one grounding portion electrically connected to the shielding leg.

6. The electronic package of claim 1, wherein the carrier structure has at least one grounding portion electrically connected to the heat dissipation member.

7. A method of manufacturing an electronic package, comprising:
providing a package module, wherein the package module comprises a circuit structure, at least one electronic element disposed on and electrically connected to the circuit structure, an encapsulation layer disposed on the circuit structure and covering the electronic element, and shielding bodies embedded within the encapsulation layer and surrounding the electronic element, wherein end surfaces of the shielding bodies are flush with an inactive surface of the electronic element and a surface of the encapsulation layer;
disposing the package module on one side of a carrier structure, wherein the circuit structure is electrically connected to the carrier structure;
disposing a shielding member on the carrier structure, wherein the shielding member covers the package module, and wherein the shielding element comprises a metal sheet covering the electronic element and at least one shielding leg for supporting the metal sheet on the carrier structure, such that the shielding leg covers a side surface of the package module, and wherein the shielding bodies are in contact with the metal sheet; and
disposing a heat dissipation member on the carrier structure,
wherein the heat dissipation member is connected to the shielding member, and the shielding member is between the at least one electronic element and the heat dissipation member.

8. The method of claim 7, wherein a plurality of the electronic elements are disposed on the circuit structure, such that at least one of the shielding bodies is located between two adjacent ones of the electronic elements.

9. The method of claim 7, wherein the package module is disposed on the carrier structure via a plurality of conductive elements.

10. The method of claim 7, further comprising disposing a plurality of solder balls on the other side of the carrier structure.

11. The method of claim 7, wherein the carrier structure has at least one grounding portion electrically connected to the shielding leg.

12. The method of claim 7, wherein the carrier structure has at least one grounding portion electrically connected to the heat dissipation member.

* * * * *